United States Patent [19]
Yang et al.

[11] Patent Number: 6,156,188
[45] Date of Patent: Dec. 5, 2000

[54] METHOD FOR MAKING A PROBE DEVICE HAVING DETECTIVE FUNCTION

[75] Inventors: Ching-Tang Yang, Tai Nan; Yun-Hui Chang, Ping Tung Hsien; Shih-Che Lo, I Lan Hsien, all of Taiwan

[73] Assignee: Industrial Technology Research Institute, Hsin Chu, Taiwan

[21] Appl. No.: 09/336,742

[22] Filed: Jun. 21, 1999

[51] Int. Cl.[7] .................................................. B23H 5/00
[52] U.S. Cl. ...................... 205/664; 219/69.17; 205/662; 205/665; 205/668
[58] Field of Search .................................. 205/664, 668, 205/665, 662; 219/69.17, 69.12

[56] References Cited

U.S. PATENT DOCUMENTS

| | | | |
|---|---|---|---|
| 4,367,129 | 1/1983 | Inoue | 204/129.55 |
| 5,145,564 | 9/1992 | Lemke et al. | 204/129.55 |
| 5,507,925 | 4/1996 | Brew | 205/660 |
| 5,739,497 | 4/1998 | Tanaka | 219/69.14 |

*Primary Examiner*—Kathryn Gorgos
*Assistant Examiner*—Thomas H Parsons
*Attorney, Agent, or Firm*—Browdy And Neimark

[57] ABSTRACT

A method for making a probe device makes use of the main shaft of an electrodischarge machining machine to mount thereon a probe for effecting the drilling operation of a PCB board. Upon completion of the drilling operation, the probe is severed and then fastened with the PCB board.

13 Claims, 8 Drawing Sheets

METHOD FOR MAKING A PROBE DEVICE HAVING DETECTIVE FUNCTION

BACKGROUND OF THE INVENTION

1. Field of the Invention

The present invention relates generally to a method for making a probe device having a detective function, and more particularly to an automatic process for making the probe device by applying the microelectrodischarge machining (Micro-EDM) technology and the electrochemical discharge machining technology.

2. Description Related Art

As shown in FIG. 1, a probing device, such as a probe card 1, is used for testing the circuit function of a wafer 2. In the process of doing such testing, the probe card 1 must come in contact smoothly with the circuit of the wafer 2. The test value is then transmitted to a computer for determining the normality of function of the circuit on the wafer. The probe card 1 is formed of a printed circuit board (PCB) 3 on which the circuit is arranged for testing purpose. There are a plurality of probes 4 which are arranged in the underside of the PCB 3. The arrangement of the probes 4 is specifically designed such that the number and the layout of the probes 4 are dependent on the wafers different in circuit function.

There are two kinds of the probe cards. The first kind is an epoxy resin ring probe card. The second kind is a vertical contact probe card. The epoxy resin probe card has advantages of being suitable for use for probing a high-density wafer and for testing the multiple wafer, and disadvantages of having a smoothness which can not be easily controlled to result in the uneven exertion of application force of the probes on the wafer. The vertical contact probe card has a better probe smoothness, and a low density which is responsible for making the method for producing a probe rather complicated.

As shown in FIG. 2, the epoxy resin probe card is made by a conventional method which is time-consuming and is not cost-effective at best. The method includes the steps as follows:

1. The coordinate values of the holes to be drilled are entered into a numerically-controlled drilling system to facilitate the drilling of holes on a plastic piece.

2. The probes are manually fastened with the holes of the plastic piece.

3. The probes are secured to the holes of the plastic piece which is provided with a coating of epoxy resin.

4. The smoothness of each probe and the position of each probe are observed with the naked eye.

5. The plastic piece is baked.

6. The plastic piece is welded to a PCB board.

7. The microadjustment of the smoothness and the location of each probe is done manually.

8. The probe card is tested manually.

9. The probe card is finally produced.

It is therefore readily apparent that the conventional method described above is not cost-effective, and that the conventional method described above is not able to produce a probe card with precision in terms of the vertical smoothness of the probes and the horizontal position of the probes.

SUMMARY OF THE INVENTION

It is therefore the primary objective of the present invention to provide an automated process for making a probing device at low cost.

It is another objective of the present invention to provide a method for making a versatile probing device having an excellent smoothness and a high density.

In keeping with the principle of the present invention, the foregoing objectives of the present invention are attained by a method for making a probing device by applying the principle of the microelectrodischarge machining and the microdischarge grinding. The method makes use of a discharge machining main shaft which is digitally controlled and provided with a probe. The probe is ground by the microdischarge grinding machine and is then treated electrochemically such that a nonconductive area is formed on the probe. The nonconductive area is subject to breakdown under the high voltage, thereby resulting in an electrodischarge action. The heat which is generated by the electrodischarge action is used to finish the microholes of a PCB. The probe is further ground to conform to a specification and is then welded to the PCB.

The foregoing objectives, features, and functions of the present invention will be more readily understood upon a thoughtful deliberation of the following detailed description of the embodiments of the present invention with reference to the accompanying drawings.

DETAILED DESCRIPTION OF THE INVENTION

Figure 1:
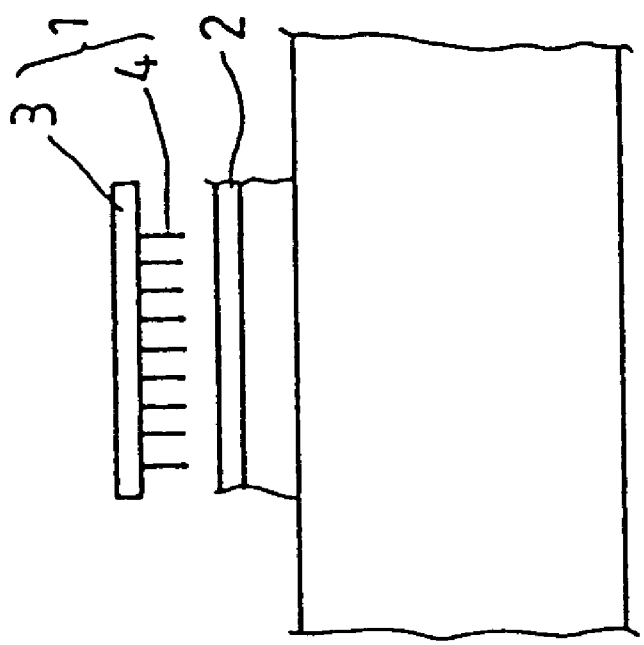
FIG. 1 shows a schematic view of a conventional probe card in use for testing a wafer.
Figure 2:
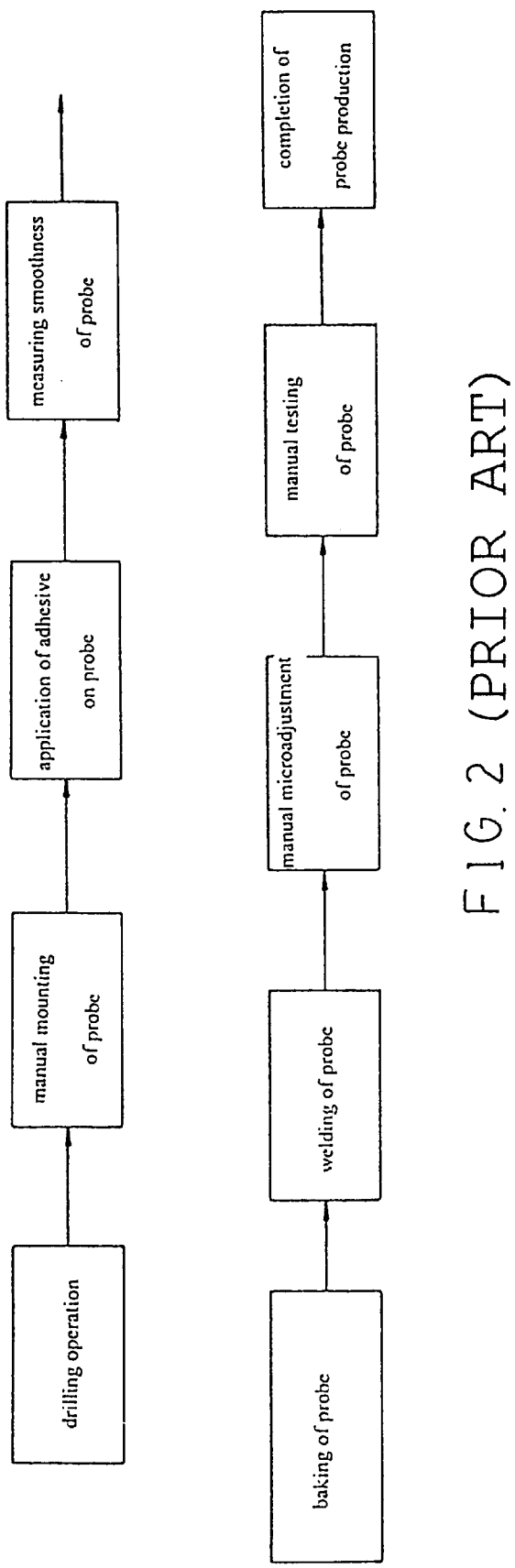
FIG. 2 shows a flow chart of a process for making a conventional epoxy resin probe card.
Figure 3:
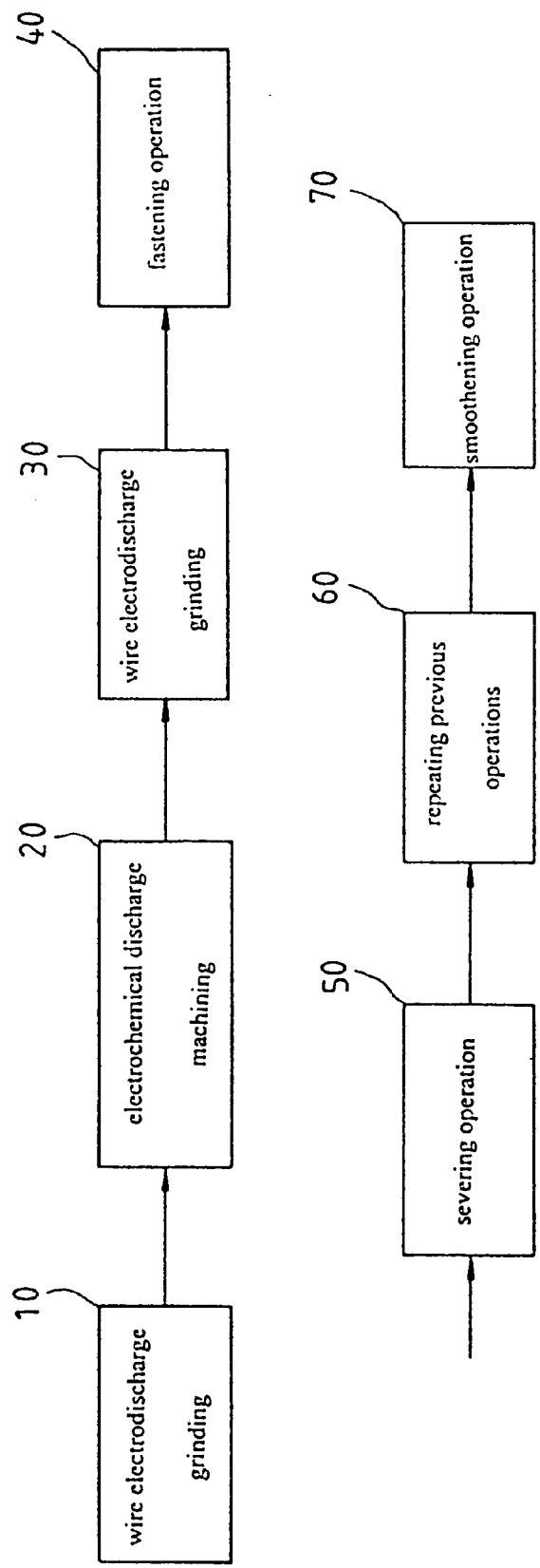
FIG. 3 shows a process flow chart of a first preferred embodiment of the present invention.
Figure 4:
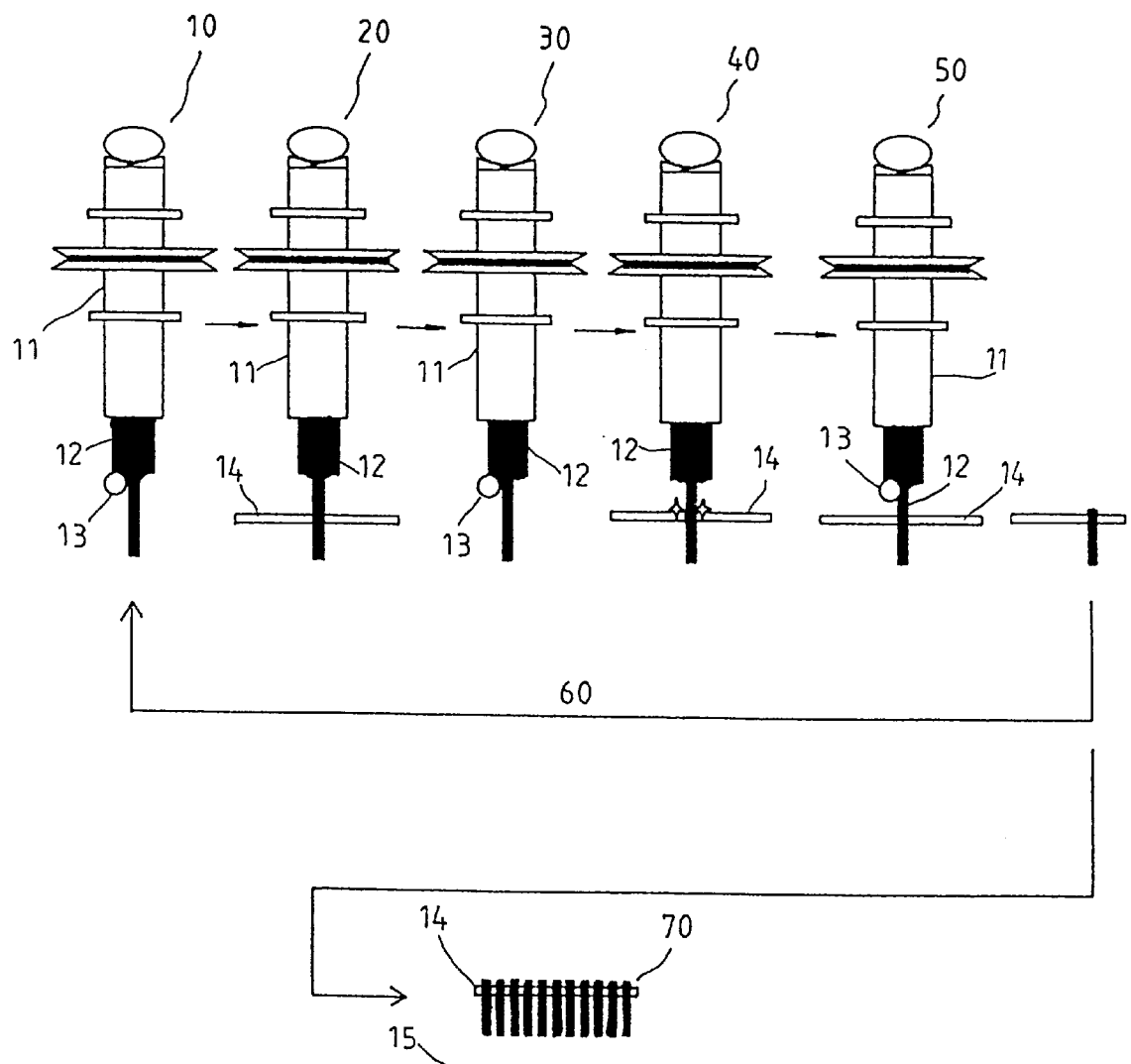
FIG. 4 shows a schematic view of the first preferred embodiment of the present invention at work.
Figure 5:
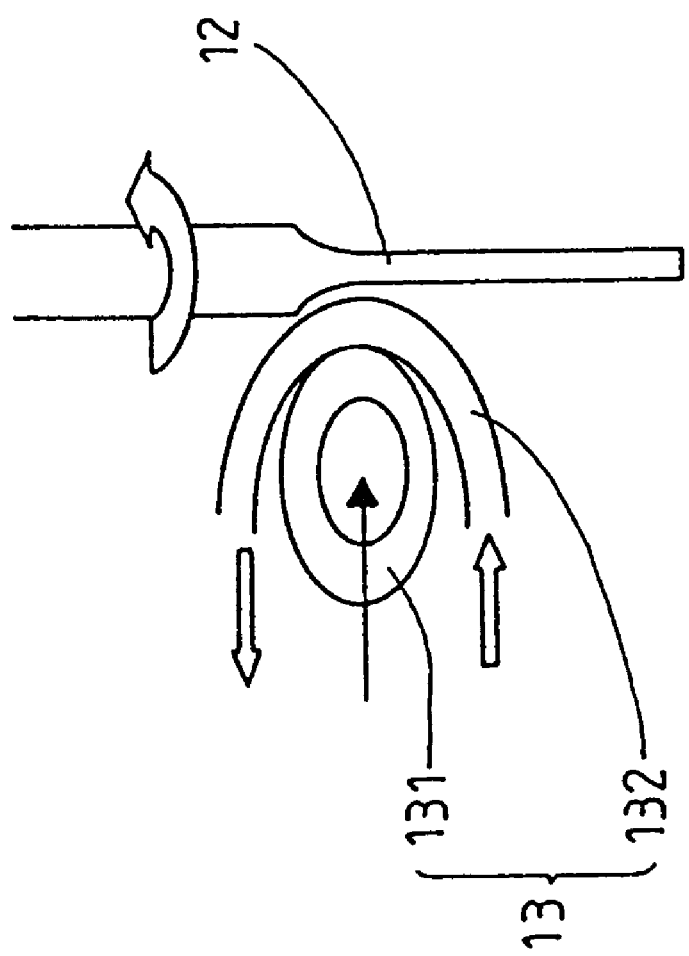
FIG. 5 shows a schematic view of the wire electrodischarge grinding of the first preferred embodiment of the present invention.
Figure 6:
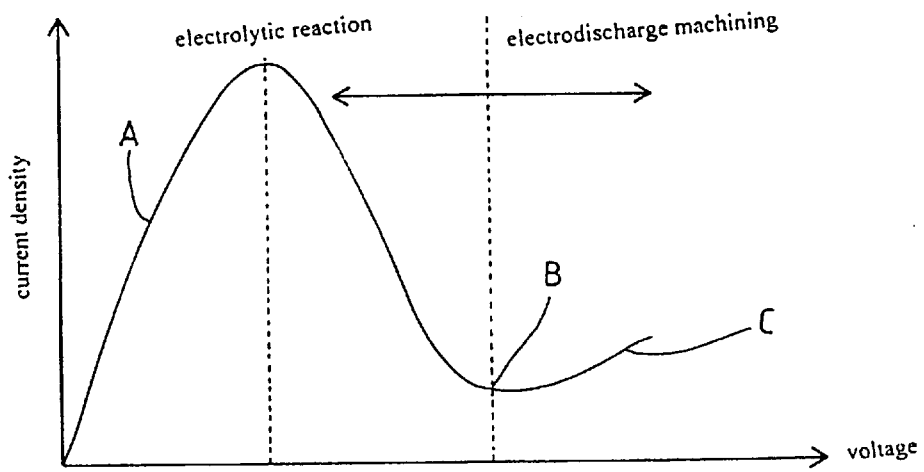
FIG. 6 is a diagram showing the relationship between the current density and the electrochemical discharge machining of the first preferred embodiment of the present invention.

As shown in FIGS. 3–7, a process flow of the first preferred embodiment of the present invention includes the steps, which are described in sequence hereinafter.

A wire electrodischarge grinding operation (WEDG) 10 makes use of a probe 12 which is mounted on a main shaft 11 of a discharge machining machine, and a wire discharge device 13 which is in fact a copper wire guiding device 131 for reducing the discharging gap by replenishing uninterruptedly a copper wire 132. The single discharge time is reduced to 50 nsec, so as to produce a microelectrode. A plasma passage is formed between the copper wire disposed in the insulation solution tank and the probe 12 mounted on the main shaft 11 of the discharge machining machine. The insulation solution is thus vaporized to expand, thereby bringing about an impact force which is used to remove the molten portion of the circumference of the probe 12. As a result, the probe 12 is ground to have a size smaller than Φ 10 μm.

Figure 7A:
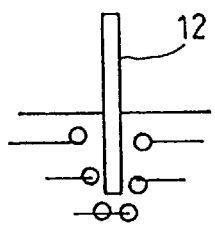
FIGS. 7A, 7B and 7C are schematic views of the probes in the areas A, B, C of FIG. 6.
Figure 7B:
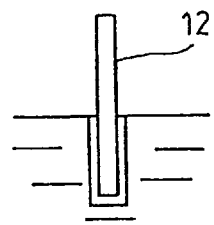
Figure 7C:
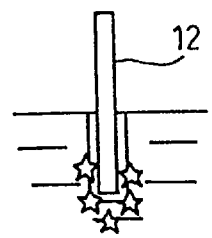

An electrochemical discharge machining (ECDM) 20 is a technique used for machining a material nonconductive to electricity. The technique involves the formation of the current path of a nonconductive area at the place where the PCB and the finished probe come in contact in the electrolyte. When probe 12 mounted on the main shaft 11 is engaged in the discharging operation, there is a sufficient potential gradient to bring about a chemical reaction on the probe, thereby causing a partial boiling of the electrolyte, as shown in FIG. 6A and FIG. 7A, so as to form a layer of nonconductive area, as shown in FIG. 6B and FIG. 7B. When the nonconductive area is caused to break down, as shown in FIG. 6C and FIG. 7C, an electrolytic discharge is brought about. As a result, the probe 12 penetrates the PCB 14 to effect the micro-machining of the through hole such that the through hole has a size smaller than $\Phi$ 10 $\mu$m.

The probe 12 acts as an electrode in the ECDM described above, the probe 12 wears out somewhat. The probe 12 is thus removed from the PCB board 14 and is further finished by another WEDG 30. If the probe 12 is not intended for use in a high precision testing, the above process of finishing the probe 12 by another WEDG 30 can be omitted in the event that the machining conditions are stable, and that the quantity of the electrode consumption can be calculated beforehand.

A fastening process 40 involves the fastening of the probe 12 with the PCB board 14 by micro-welding.

A severing operation 50 includes a process in which the top of the probe 12 is severed by a wire electrodischarge device 13, or the main shaft 11 in motion.

A repetitive operation 60 is carried out to produce a probe card having a desired number of the probe 12 which are disposed at the desired positions, by repeating in sequence the processes 10, 20, 30, 40, and 50 described above.

A smoothening process 70 is carried out in such a manner that the probes 12 of the PCB 14 face downward to engage in the electrodischarge machining along with a copper electrode plate 15 which has been previously ground and has a plane degree smaller than 5 $\mu$m. The smoothness of the probe card is thus attained.

The method of the present invention is carried out in such a manner that the PCB board 14 is disposed in the machining solution tank, and that the probe 12 is mounted on the main shaft 11 of the electrodischarge machining machine to facilitate the grinding of the probe 12, and further that the drilling of the PCB board 14, the fastening of the probe 12 with the PCB board 14, and the severing and the smoothening operations are all effected automatically. The number and the position of the probes 12 of the probe card can be changed to meet the testing requirements of various wafers by modifying the control program of the electrodischarge machining machine.

Figure 8:
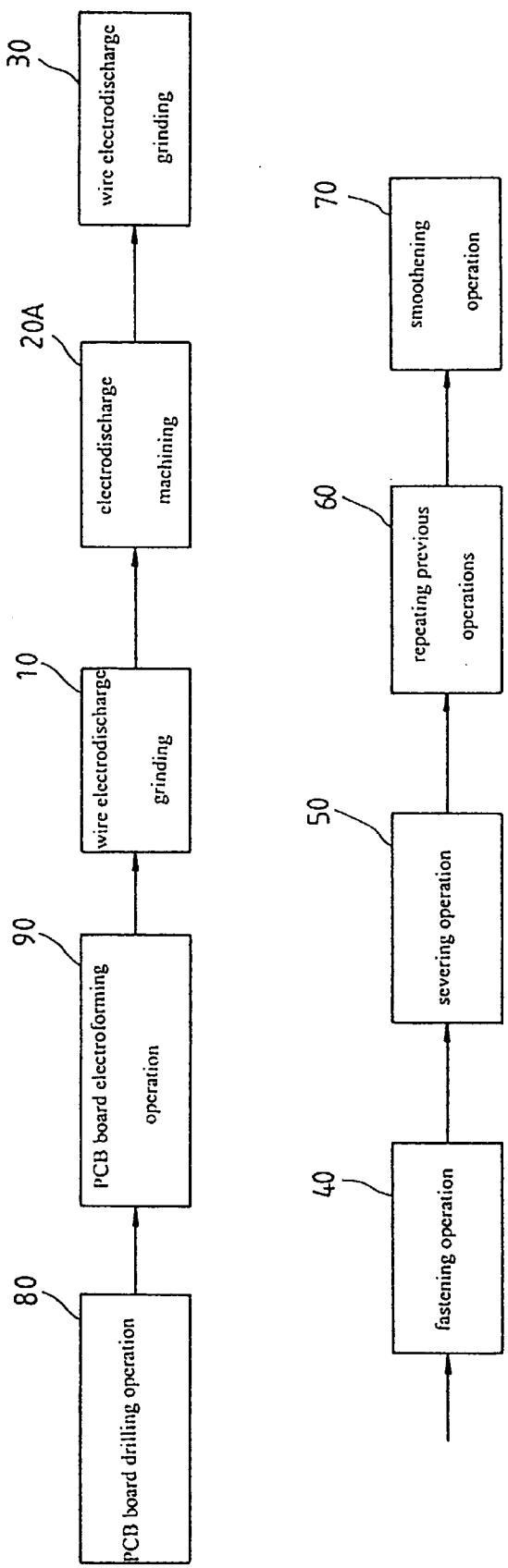
FIG. 8 shows a process flow chart of a second preferred embodiment of the present invention.
Figure 9:
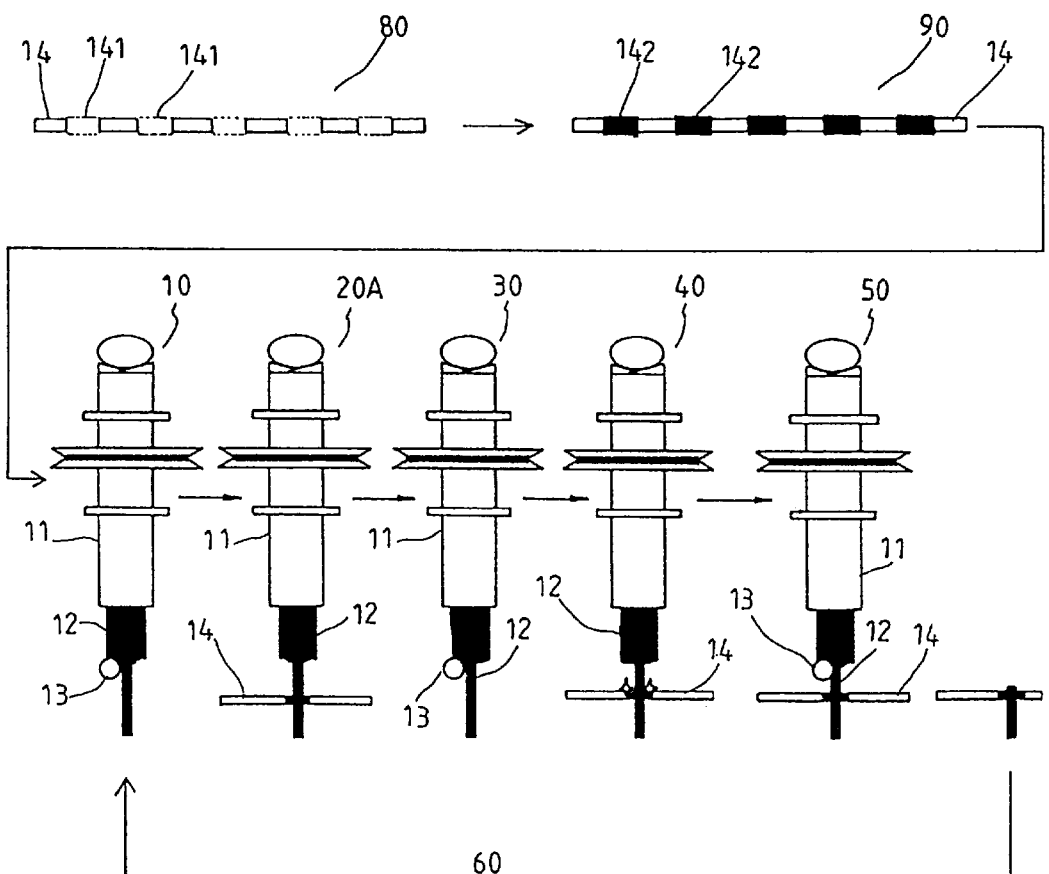
FIG. 9 shows a schematic view of the second preferred embodiment of the present invention at work.

As shown in FIGS. 8 and 9, the second preferred embodiment of the present invention is different from the first preferred embodiment of the present invention in that the PCB board 14 is pre-electroformed before the PCB board 14 is machined. In other words, a drilling operation 80 is first carried out in the PCB board 14 such that a plurality of cavities 141 are formed in places where the probes 12 are to be disposed. Thereafter, an electroforming operation 90 is carried out in each of the cavities 141 such that each cavity 141 is filled with a conductive bury area 142. The ECDM operation of the first preferred embodiment of the present invention is no longer applicable in view of the fact that the ECDM technique is used to micro-machine the nonconductive material. As a result, the EDM technique is used to carry out the discharge drilling of the bury area 142.

The probe 12 may be of a tapered construction, so as to facilitate the severing of the probe 12 at the time when the drilling of the PCB board 14 is completed by the probes 12. In light of the probe 12 being tapered, the probe 12 does not slip out of the underside of the PCB board 14 at the conclusion of the severing operation.

The embodiments of the present invention described above are to be regarded in all respects as being merely illustrative, and not restrictive. Accordingly, the present invention may be embodied in other specific forms without deviating from the spirit thereof. The present invention is therefore to be limited only by the scopes of the following appended claims.

What is claimed is:

1. A method for making a probe device, said method comprising the steps of:

(a) a wire electrodischarge grinding process making use of the main shaft of an electrodischarge machining machine to mount a probe, and a wire electrodischarge device wherein the wire electrodischarge device machines a micro-electrode on the probe such that a plasma passage is formed between the device and the probe in an insulation solution so as to cause the insulation solution to vaporize and expand, thereby bringing about an impact force to remove molten portions of the probe;

(b) an electrochemical discharge machining for forming a current path at a place where a printed circuit board (PCB) board in the electrolyte and the machined probe come in contact wherein the probe is changed chemically in the electrolyte to effect the partial boiling of the electrolyte to form a layer of nonconductive area which brings about an electrolytic discharge at the time when the nonconductive area is broken down, so as to drill the PCB board by the probe;

(c) severing the probe; and (d) fastening the probe with the PCB board.

2. The method as defined in claim 1, wherein said probe is further ground after the step (b).

3. The method as defined in claim 1, wherein the probe is machined to have a tapered shape in the step (a).

4. The method as defined in claim 1 further comprising a step (e) for smoothening the probes of the PCB board wherein the probes are smoothened by an electrodischarge machining effected by a copper electrode plate.

5. The method as defined in claim 1, wherein the step (d) is brought about by welding.

6. A method for making a probe device, the method comprising mounting a probe on a main shaft of an electrodischarge machining machine for drilling a printed circuit board (PCB) board then severing the probe and then fastening the probe with the PCB board.

7. The method as defined in claim 6, wherein the probe is further machined after the probe has completed the drilling operation.

8. The method as defined in claim 6, comprising first machining said probe to a tapered construction.

9. The method as defined in claim 6, wherein the probes of the PCB board are smoothened by an electrodischarge machining effected by a copper electrode plate after the probes are fastened with the PCB board.

10. The method as defined in claim 6, wherein the probes are fastened with the PCB board by welding.

11. A method for making a probe device, said method comprising the steps of:
   (a) electroforming a printed circuit board (PCB) board such that the PCB board is provided with a plurality of conductive bury areas for disposing probes;
   (b) a wire electrodischarge grinding process making use of the main shaft of an electrodischarge machining machine to mount the probe, and a wire electrodischarge device wherein the wire electrodischarge device machines a micro-electrode on the probe such that a plasma passage is formed between the device and the probe in insulation solution so as to cause the electrolyte to vaporize and expand, thereby bringing about an impact force to remove molten portions of the probes;
   (c) an electrodischarge machining process for bringing about an electrodischarge drilling in each of the conductive bury areas of the PCB board;
   (d) severing the probes; and
   (e) fastening the probes with the PCB board.

12. The method as defined in claim 11, wherein the probe is further ground after the step (c).

13. The method as defined in claim 11, wherein the probes of the PCB board are smoothened by an electrodischarge machining effected by a copper electrode plate after the probes are fastened with the PCB board.

* * * * *